US008554531B2

(12) United States Patent
Nicollian et al.

(10) Patent No.: US 8,554,531 B2
(45) Date of Patent: Oct. 8, 2013

(54) SYSTEM AND CIRCUIT FOR SIMULATING GATE-TO-DRAIN BREAKDOWN

(75) Inventors: Paul E. Nicollian, Dallas, TX (US); Riza T. Cakici, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 257 days.

(21) Appl. No.: 13/211,420

(22) Filed: Aug. 17, 2011

(65) Prior Publication Data

US 2012/0043619 A1 Feb. 23, 2012

Related U.S. Application Data

(60) Provisional application No. 61/375,601, filed on Aug. 20, 2010.

(51) Int. Cl.
*H03K 17/687* (2006.01)
*G06F 17/50* (2006.01)

(52) U.S. Cl.
USPC .......... 703/14; 327/581

(58) Field of Classification Search
USPC .......... 703/14; 327/581
See application file for complete search history.

(56) References Cited

U.S. PATENT DOCUMENTS 5,886,363 A * 3/1999 Hamada et al. .......... 257/48
2011/0031981 A1* 2/2011 Tsujikawa .......... 324/554

OTHER PUBLICATIONS

Kaczer, B. et al, "Impact of oxide breakdown on digital circuit operation and reliability," in IEDM Tech. Dig., 2000, pp. 553-556.
Fernandez, R. et al, "Gate oxide wear-out and breakdown effects on the performance of analog and digital circuits," IEEE Trans. Electron Devices, vol. 55, No. 4, pp. 997-1004, Apr. 2008.
Rodriguez, R. et al, "The impact of gate-oxide breakdown on SRAM stability," IEEE Electron Device Lett., vol. 23, No. 9, pp. 559-561, Sep. 2002.
Rodriguez, R. et al, "A model for gate-oxide breakdown in CMOS inverters," IEEE Electron Device Lett., vol. 24, No. 2, pp. 114-116, Feb. 2003.
Kaczer, B. et al, "Consistent model for short-channel nMOSFET after hard gate oxide breakdown," IEEE Trans. Electron Devices, vol. 49, No. 3, pp. 507-513, Mar. 2002.
Fernandez, R. et al, "MOSFET output characteristics after oxide breakdown," Micro-electron. Eng., vol. 84, No. 1, pp. 31-36, Jan. 2007.
R. Degraeve, B. Kaczer, A. De Keersgieter, and G. Groeseneken, "Relation between breakdown mode and breakdown location in short channel NMOSFETs and it impact on reliability specifications," in Proc. IRPS, 2001, pp. 360-366.

(Continued)

*Primary Examiner* — Evan Pert

(74) *Attorney, Agent, or Firm* — Jacqueline J. Garner; Wade J. Brady, III; Frederick J. Telecky, Jr.

(57) ABSTRACT

A system and circuit for simulating gate-to-drain breakdown in an N-channel field effect transistor (NFET). In one embodiment, a simulation circuit includes a primary field effect transistor (FET), a first depletion mode FET and a second depletion mode FET. The first depletion mode FET and the second depletion mode FET are connected between a gate and a drain of the primary FET. A gate and a drain of the first depletion mode FET are connected to the gate of the primary FET. A gate and a drain of the second depletion mode FET are connected to the drain of the primary FET.

22 Claims, 6 Drawing Sheets

(56) References Cited

OTHER PUBLICATIONS

Pey, K.L. et al, "Gate dielectric degradation mechanism associated with DBIE evolution," in Proc. IRPS, 2004, pp. 117-121.
Yeoh, T.S. et al, "Gate oxide breakdown model in MOS transistors," in Proc. IRPS, 1995, pp. 149-155.
Miranda, E. et al. , "Equivalent circuit model for the gate leakage current in broken down HfO2/TaN/TiN gate stacks," IEEE Electron Device Lett., vol. 29, No. 12, pp. 1353-1355, Dec. 2008.
Crupi, F. et al., "A novel method for sensing the breakdown location and its application to the reliability study of ultrathin Hf-silicate gate dielectrics," IEEE Trans. Electron Devices, vol. 52, No. 8, pp. 1759-1765, Aug. 2005.
Available: http://www-device.eecs.berkeley.edu/~bsim3/bsim4.html.
Cester, A. et al., "Collapse of MOSFET drain current after soft breakdown and its dependence on the transistor aspect ratio W/L," in Proc. IRPS, 2003, pp. 189-195.
Sune, J. et al., "Post soft breakdown conduction in SiO2 gate oxides," in IEDM Tech. Dig., 2000, pp. 533-536.
Houssa, M. et al., "Model for the current-voltage characteristics of ultrathin gate oxides after soft breakdown," J. Appl. Phys., vol. 84, No. 8, pp. 4351-4355, Oct. 1998.
Nigam, T. et al. , "Temperature dependence and conduction mechanism after analog soft breakdown," in Proc. IRPS, 2003, pp. 417-423.
Taur, Y. et al., Fundamentals of Modern VLSI Devices. Cambridge, U.K.: Cambridge Univ. Press, 1998, ch. 3.
Tang, L. J. et al., "Gate dielectric breakdown-induced microstructural damage in MOSFETs," IEEE Trans. Device Mater. Rel., vol. 4, No. 1, pp. 38-45, Mar. 2004.
Sakurai, T. et al., "Alpha-power law MOSFET model and its applications to CMOS inverter delay and other formulas," IEEE J. Solid-State Circuits, vol. 25, No. 2, pp. 584-594, Apr. 1990.
Cheng, Y. et al., "A physical and scalable I-V model in BSIM3v3 for analog/ digital circuit simulation," IEEE Trans. Electron Devices, vol. 44, No. 2, pp. 277-287, Feb. 1997.
Nicollian, Paul E. et al., "Device Characteristics and Equivalent Circuits for NMOS Gate-to-Drain Soft and Hard Breakdown in Polysilicon/SiON Gate Stacks," IEEE Trans. Electron Devices, vol. 58, No. 4, pp. 1170-1175, Apr. 2011.

* cited by examiner

SYSTEM AND CIRCUIT FOR SIMULATING GATE-TO-DRAIN BREAKDOWN

CROSS-REFERENCE TO RELATED APPLICATION

The present application claims priority to U.S. Provisional Patent Application No. 61/375,601, filed on Aug. 20, 2010 entitled "Equivalent Circuit for N-Channel MOSFET Gate-to-Drain Breakdown in Ultra-Thin SiON Dielectrics;" which is hereby incorporated herein by reference in its entirety.

BACKGROUND

The currents in all terminals of an N-channel field effect transistor (NFET) can be severely degraded when a soft or hard dielectric breakdown event occurs from gate to drain. Gate-drain breakdown in NFETs is expected to become an increasingly prevalent failure mode as channel length is scaled, and is more problematic than a gate-pwell breakdown because an input/output node failure is more probable. The severity of post gate-drain dielectric breakdown may be due to the low resistance of the source-drain extension region, the large energy dissipated during breakdown between the gate and the strongly accumulated source-drain extension, and/or the microscopic details of the gate-to-drain breakdown path.

Time to first breakdown event has historically been applied as the time-to-breakdown used to assess the reliability of ultra thin gate dielectrics. However, some circuits can remain operative after first breakdown. Consequently, if the time to circuit failure can be extended beyond the first breakdown event, the corresponding relaxation in reliability requirements can enable higher safe operating voltages to achieve higher performance. It is therefore desirable to have the capability to simulate the effects of breakdown on circuit functionality. Such simulations are often performed using computer-based circuitry simulation systems, such as Simulation Program with Integrated Circuit Emphasis (SPICE) and suitable device models. Effective simulation of post-breakdown circuit operation requires an equivalent circuit that accurately models the post breakdown electrical characteristics of the transistor.

SUMMARY

A system and circuit for simulating gate-to-drain breakdown in an N-channel field effect transistor (NFET) are disclosed herein. In one embodiment, a circuit simulation system includes a processor and a circuit simulator module. The circuit simulator module, when executed, causes the processor to simulate operation of an electronic circuit. The circuit simulator module includes a field effect transistor (FET) model. The FET model is configured to emulate a FET in a condition of dielectric breakdown. The FET model includes models of a primary FET, a first depletion mode FET, and a second depletion mode FET. The first and second depletion mode FETs are connected between a gate and a drain of the primary FET. A gate and a drain of the first depletion mode FET are connected to the gate of the primary FET. A gate and a drain of the second depletion mode FET are connected to the drain of the primary FET.

In another embodiment, a computer-readable storage medium is encoded with a field effect transistor (FET) model. The model causes a computer to simulate a primary FET and two depletion mode FETs operating in saturation between a gate and a drain of the primary FET. The depletion mode FETs provide a polarity symmetric gate current and emulate a power law exponent.

In a further embodiment, a method includes simulating, by a computer, operation of a field effect transistor (FET). The simulating comprises computing signal values based on a model of the FET. The model emulates a primary FET, and a first and a second depletion mode FET operating in saturation between a gate and a drain of the primary FET. A gate and a drain of the first depletion mode FET are connected to the gate of the primary FET. A gate and a drain of the second depletion mode FET are connected to the drain of the primary FET.

In a yet further embodiment, a simulation circuit includes a primary field effect transistor (FET), a first depletion mode FET and a second depletion mode FET. The first depletion mode FET and the second depletion mode FET are connected between a gate and a drain of the primary FET. A gate and a drain of the first depletion mode FET are connected to the gate of the primary FET. A gate and a drain of the second depletion mode FET are connected to the drain of the primary FET.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
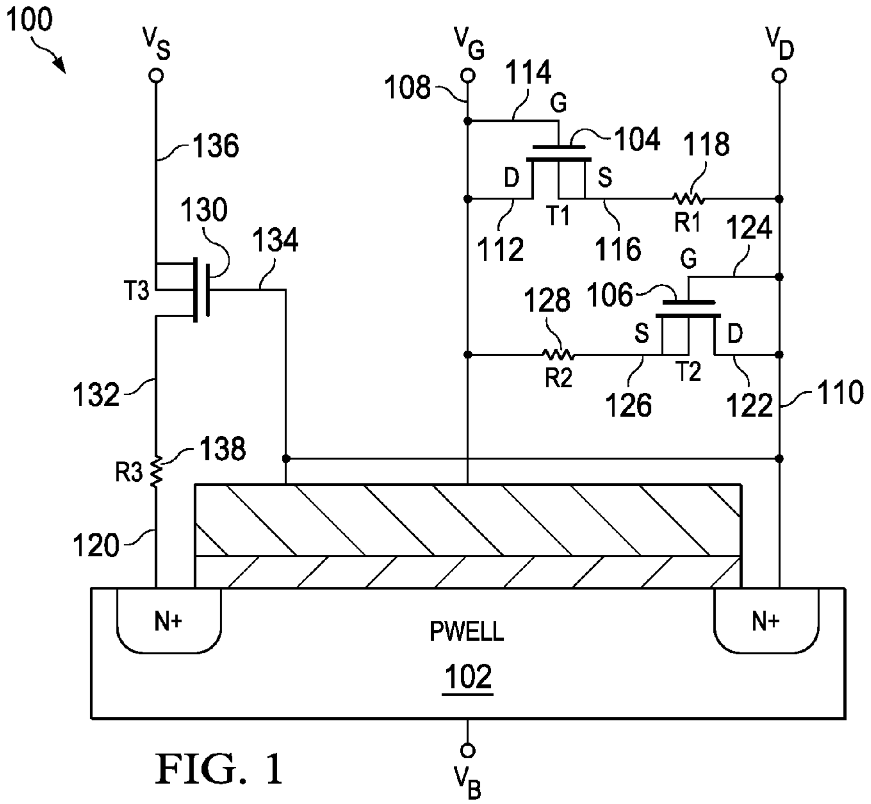
FIG. 1 shows schematic diagram for an equivalent circuit modeling a negative channel field effect transistor (NFET) with gate-drain soft breakdown (SBD) in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct electrical connection. Thus, if a first device couples to a second device, that connection may be through a direct electrical connection, or through an indirect electrical connection via other devices and connections. The term "connects" or "connected" is intended to indicate a direct engagement of two devices unless engagement through another device is specified.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Equivalent circuits employing resistors, diodes and resistors, and current sources are commonly employed with device simulators to model gate-to-drain breakdown in a negative channel field effect transistor (NFET). However, in equivalent circuits where gate-to-drain breakdown includes device elements only between gate and drain terminals of an NFET, drain current degradation is severely underestimated except when $|V_{GD}|>>0$. Such circuits also fail to model the effects of breakdown on source current, which plays a critical role in inverter stability. Moreover, existing models fail to explain the presence of current degradation in any terminal when $V_G=V_D$ (e.g. mid-voltage). The inclusion of current sources fails to solve these problems because the coupling between the device terminals after breakdown is complex. Another approach incorporates three resistors; from gate-drain, gate-source, and gate-body. However, this approach also fails to adequately describe the source current after gate-drain SBD.

Coupling between device terminals of an NFET with gate-drain breakdown is complex, and cannot be replicated by existing models. Performance measurements of NFETs experiencing gate-drain breakdown show that the key features of gate-drain breakdown are:

(i) SBD $I_G$ follows a power law in $V_G$ with an exponent from 1.7 to 2.0 so that for the exponent N, 1<N<2 encompasses gate-drain soft breakdown (SBD) and hard breakdown (HBD). HBD may be defined as having occurred when the post breakdown slope of log $I_G$ versus log $V_G$ is equal to one (ohmic behavior).

(ii) $I_G$ is polarity symmetric in $V_{GD}$.

(iii) All terminal currents are degraded after breakdown across a wide range of voltage, including when $V_G=V_D$.

(iv) The source does not contribute to gate current after SBD and is strongly coupled to the drain at any voltage. The source is coupled to the gate after HBD except when $V_D \sim V_G$.

Embodiments of the equivalent circuit model disclosed herein accurately account for gate, drain, and source currents for an NFET experiencing either SBD or HBD across the full range of drain and gate voltages that the NFET is subjected to in a circuit. The embodiments of the equivalent circuit are suitable for modeling of circuit reliability using simulation systems, such as Simulation Program with Integrated Circuit Emphasis (SPICE).

FIG. 1 shows schematic diagram for an equivalent circuit 100 of a NFET with gate-drain SBD in accordance with various embodiments. The equivalent circuit 100 includes a primary NFET 102. The primary NFET 102 may include a polysilicon gate electrode and silicon oxynitride gate dielectric. A pair of depletion mode NFETs 104, 106 operating in saturation mode couple the gate 108 and the drain 110 of the NFET 102. The gate 114 and drain 112 of the depletion mode NFET 104 are connected to the gate 108 of the primary NFET 102. The source 116 of the depletion mode NFET 104 is connected to the drain 110 of the primary NFET 102 via a series current limiting resistor 118. The gate 124 and drain 122 of the depletion mode NFET 106 are connected to the drain 110 of the primary NFET 102. The source 126 of the depletion mode NFET 106 is connected to the gate 108 of the primary NFET 102 via a series current limiting resistor 128.

The depletion mode NFETs 104, 106 and associated resistors 118, 128 provide a gate current that is polarity symmetric in $V_{GD}$ and emulates a power law exponent from 1 to 2. The exponent of 2 is the long channel saturation current limit, i.e. $I_{DSAT} \sim k(V_G-V_T)^2$, and the exponent of 1 is the short channel velocity saturated limit. Thus, the power law exponent can be varied between 1 and 2.

A third FET 130 couples the drain 110 and the source 120 of the primary NFET 102. The gate of the FET 130 is connected to the drain 110 of the primary NFET 102. The drain 132 of the FET 130 is connected to the source 120 of the primary NFET 102 via a series current limiting resistor 138. The source 136 of the FET 130 serves as the source terminal for the equivalent circuit 100. The FET 130 is operated in the linear mode to provide a voltage controlled resistance that together with its series resistor 138, models the drain to source coupling characteristic of NFET gate-drain breakdown.

Figure 2:
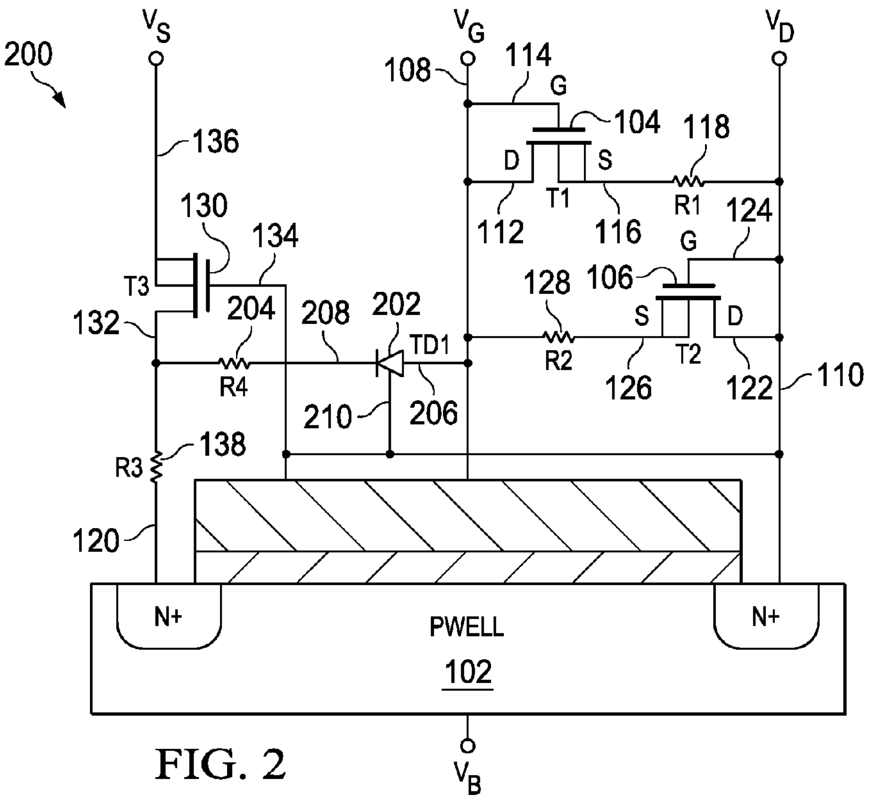
FIG. 2 shows schematic diagram for an equivalent circuit modeling an NFET with gate-drain SBD or hard breakdown (HBD) in accordance with various embodiments.

FIG. 2 shows schematic diagram for an equivalent circuit 200 of an NFET with gate-drain SBD or HBD in accordance with various embodiments. The circuit 200 includes the NFET 102, depletion mode NFETs 104, 106, source terminal FET 130, and resistors 118, 128, and 138 connected as described above with regard to equivalent circuit 100.

The equivalent circuit 200 also includes a drain-controlled-gate-channel-oxide-tunneling diode 202 and a resistor 204. The anode 206 of the diode 202 is connected to the gate 108 of the primary NFET 102. The cathode 208 of the diode 202 is connected to the drain 132 of the source terminal FET 130 through the series current limiting resistor 204. The control terminal 210 of the diode 202 is connected to the drain 110 of the primary NFET 102. The diode 202 and resistor 204 couple the gate 108 and the source 120 of the primary NFET 102 providing exponential source current flow in the gate 108 as found after HBD.

Figure 3:
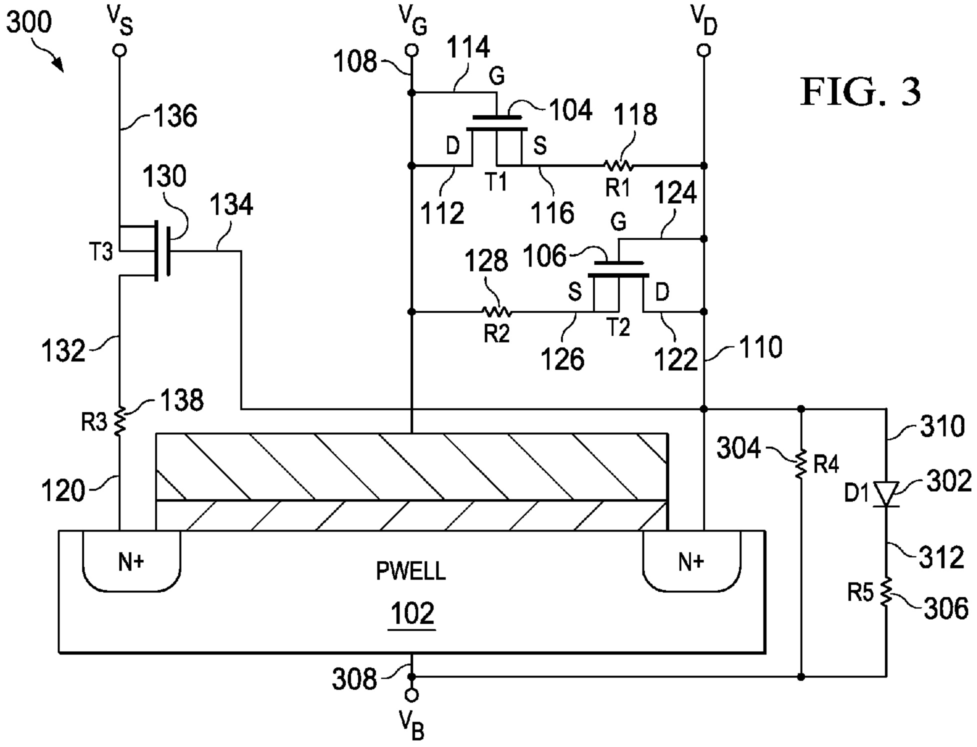
FIG. 3 shows a schematic diagram for an equivalent circuit employing four terminals of an NFET for gate-drain SBD modeling in accordance with various embodiments.

FIG. 3 shows a schematic diagram for an equivalent circuit 300 employing four terminals of the NFET 102 for gate-drain SBD modeling in accordance with various embodiments. The circuit 300 includes the NFET 102, depletion mode NFETs 104, 106, source terminal FET 130, and resistors 118, 128, and 138 connected as described above with regard to equivalent circuit 100.

The equivalent circuit 300 also includes a diode 302 and resistors 304 and 306. The resistor 304 connects the drain 110 of the primary NFET 102 to the P-well bias voltage terminal 308 of the primary NFET 102. In parallel with the resistor 304, the diode 302 and series resistor 306 also connect the drain 110 of the primary NFET 102 to the P-well bias voltage terminal 308. The anode 310 of the diode 302 is connected to the drain 110 of the primary NFET 102. The cathode 312 of the diode 302 is connected to the P-well bias voltage terminal 308 of the primary NFET 102 via the series resistor 306. In other embodiments, the circuit positions of the diode 302 and the series resistor 306 may be swapped. The diode 302 simulates changing P-well bias current exponentially with gate voltage. The resistors 304 and 306 provide for tuning of the bias current.

Figure 4:
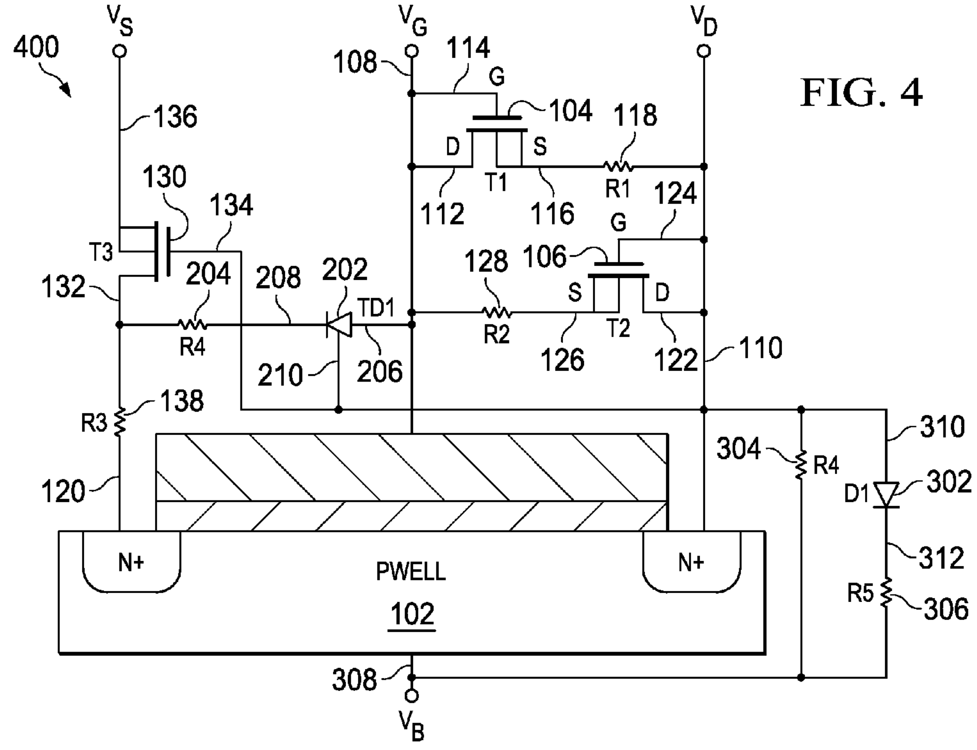
FIG. 4 shows a schematic diagram for an equivalent circuit employing four terminals of an NFET for gate-drain SBD or HBD modeling in accordance with various embodiments.

FIG. 4 shows a schematic diagram for an equivalent circuit 400 employing four terminals of an NFET for gate-drain SBD or HBD modeling in accordance with various embodiments. The circuit 400 includes the NFET 102, depletion mode NFETs 104, 106, source terminal FET 130, tunneling diode 202, and resistors 118, 128, 138, and 204 connected as described above with regard to equivalent circuit 200. The circuit 400 also includes the diode 302 and resistors 304 and 306 connecting the drain 110 of the primary NFET 102 to the P-well bias voltage terminal 308 of the primary NFET 102 as described above with regard to equivalent circuit 300.

Figure 5:
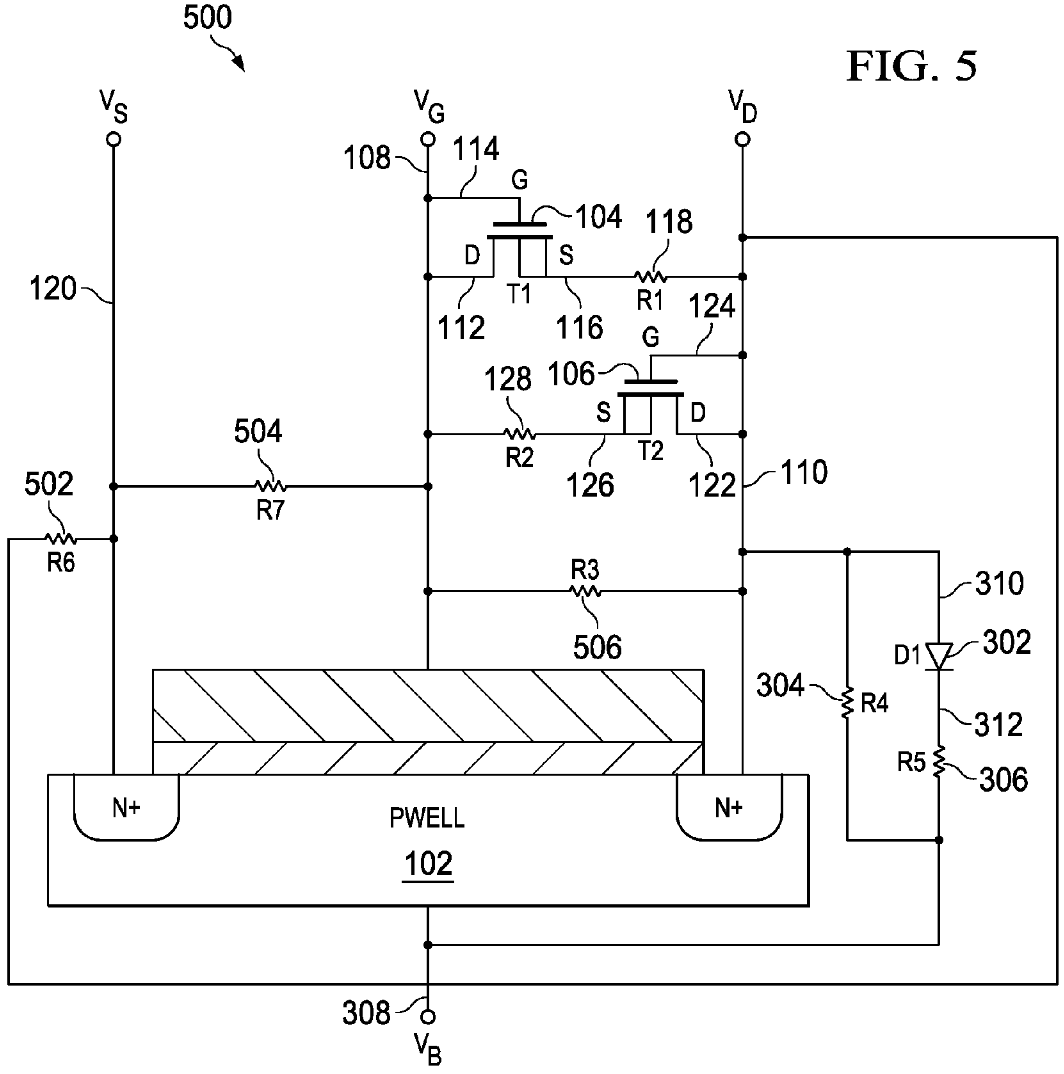
FIG. 5 shows a schematic diagram for an alternative equivalent circuit employing four terminals of an NFET for gate-drain SBD or HBD modeling in accordance with various embodiments.

FIG. 5 shows a schematic diagram for an alternative equivalent circuit 500 employing four terminals of an NFET for gate-drain SBD or HBD modeling in accordance with various embodiments. The circuit 500 includes the NFET 102, depletion mode NFETs 104, 106, diode 302, and resistors 118, 128, 304, and 306 connected as described above with regard to equivalent circuit 300.

The circuit 500 also include resistors 502, 504, and 506 coupling the source 120, gate 108, and drain 110 of the NFET 102. The source 120 of the NFET 102 is connected to the drain 110 of the NFET 102 through the resistor 502. The source 120 of the NFET 102 is connected to the gate 108 of the NFET 102 through the resistor 504. The gate 108 of the NFET 102 is connected to the drain 110 of the NFET 102 through the resistor 506. The resistors 502 and 504 provide for non-zero gate and drain currents when the gate and drain voltages are equal. The circuit 500 lacks the source terminal FET 130 and series resistor 138 included in the equivalent circuit 300.

Figure 6A:
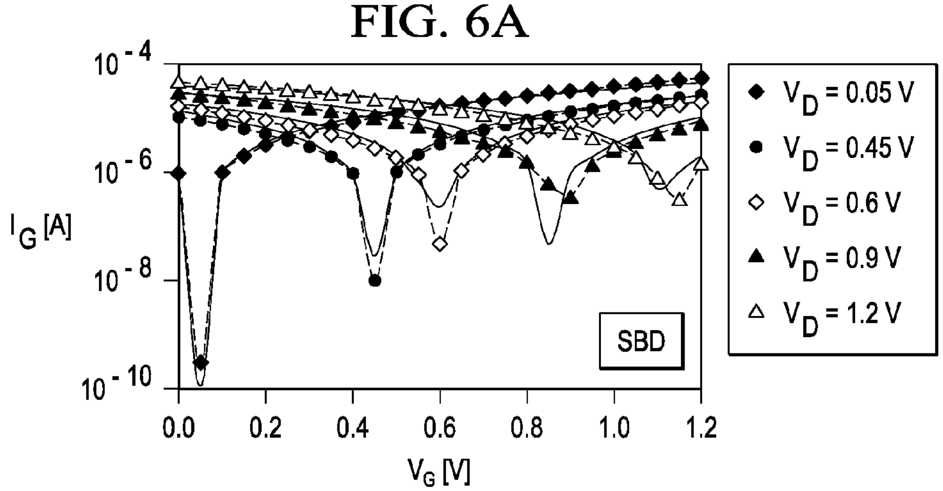
FIGS. 6A-6G show comparisons of device measurements to results of equivalent circuit simulations in accordance with various embodiments.
Figure 6B:
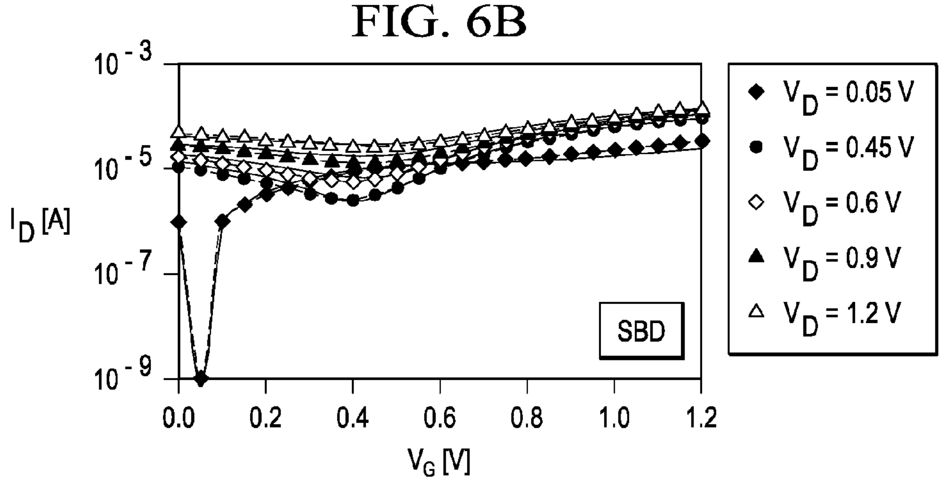
Figure 6C:
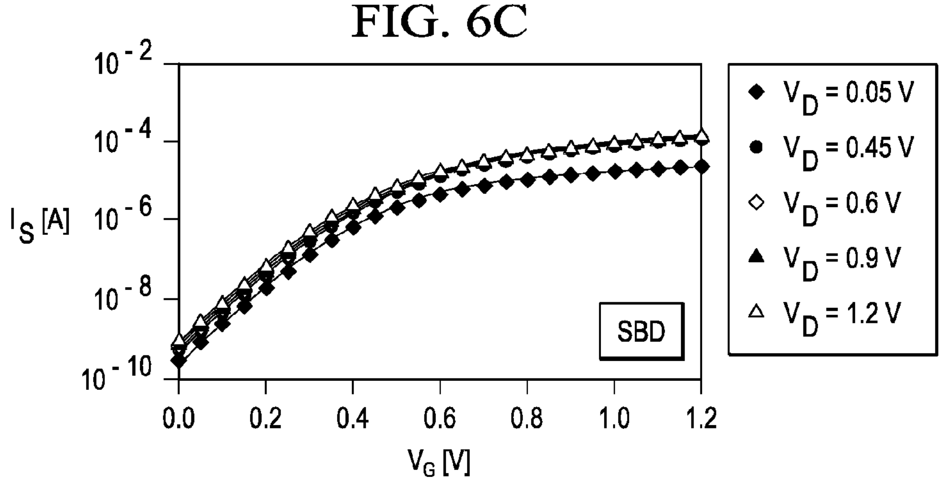
Figure 6D:
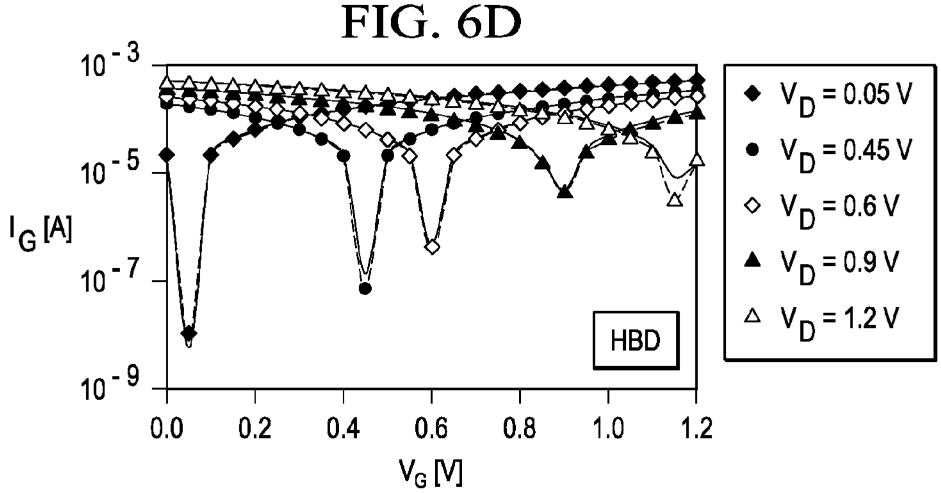
Figure 6E:
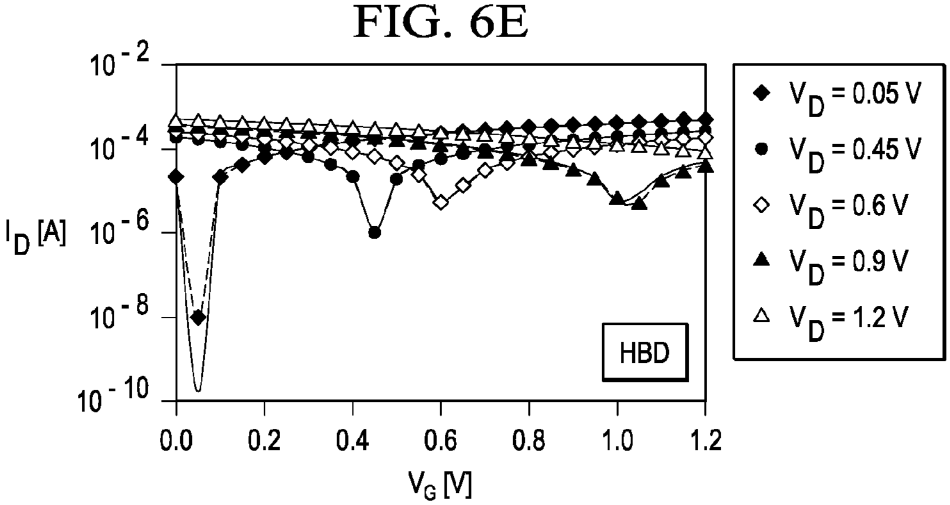
Figure 6F:
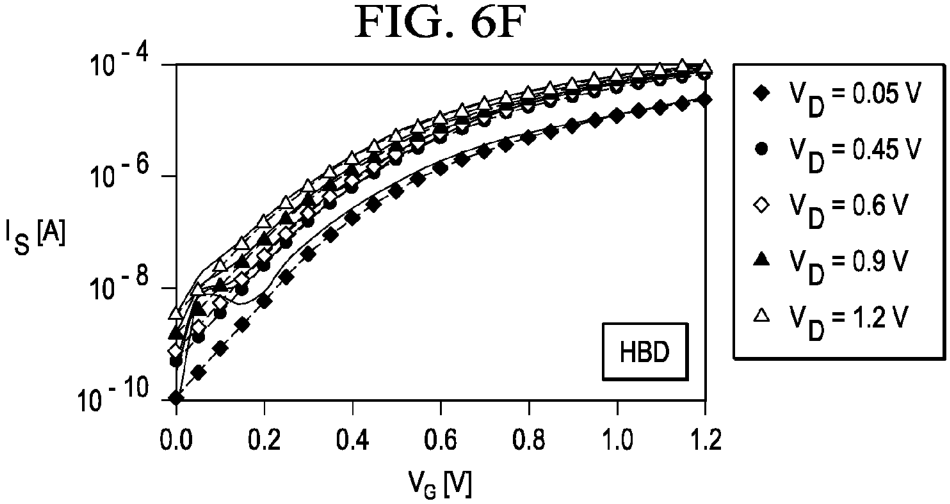

FIGS. 6A-6G show comparisons of measurements obtained from devices in SBD or HBD to results of simulations of embodiments of the equivalent circuit of the present disclosure. FIGS. 6A, 6B, and 6C show respective gate, drain, and source currents versus gate voltage comparisons for a device in SBD and embodiments of the equivalent circuit disclosed herein. FIGS. 6D. 6E, and 6F show respective gate, drain, and source currents versus gate voltage comparisons for device in HBD and embodiments of the equivalent circuit disclosed herein. Solid lines represent equivalent circuit simulation results and symbols connected by dashed lines represent device measurements at various drain voltages. FIGS. 6A-6F show that embodiments of the equivalent circuits of the present disclosure provide excellent fits for measured gate, source, and drain currents over a large voltage range.

Figure 6G:
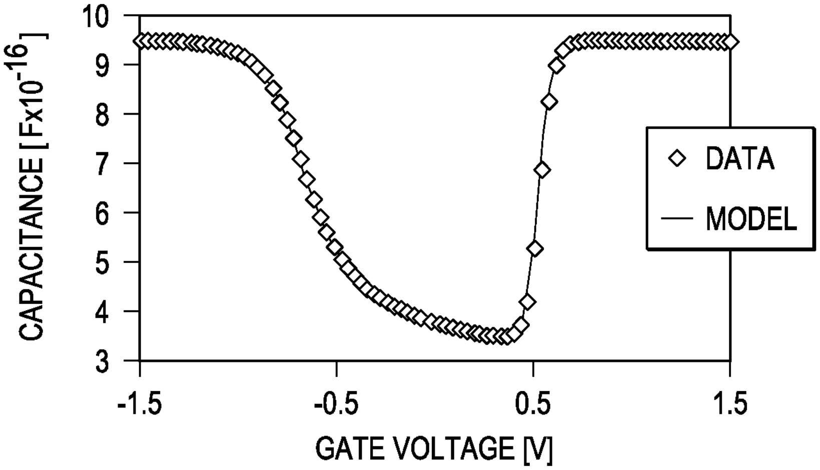

FIG. 6G shows a comparison of capacitance versus gate voltage for the primary NFET 102 with and without the equivalent circuit components (eg., FETs 104, 106, 130, and other components) that provide breakdown simulation. As shown, embodiments of the equivalent circuits disclosed herein do not introduce significant parasitic capacitance to the primary NFET 102.

Figure 7:
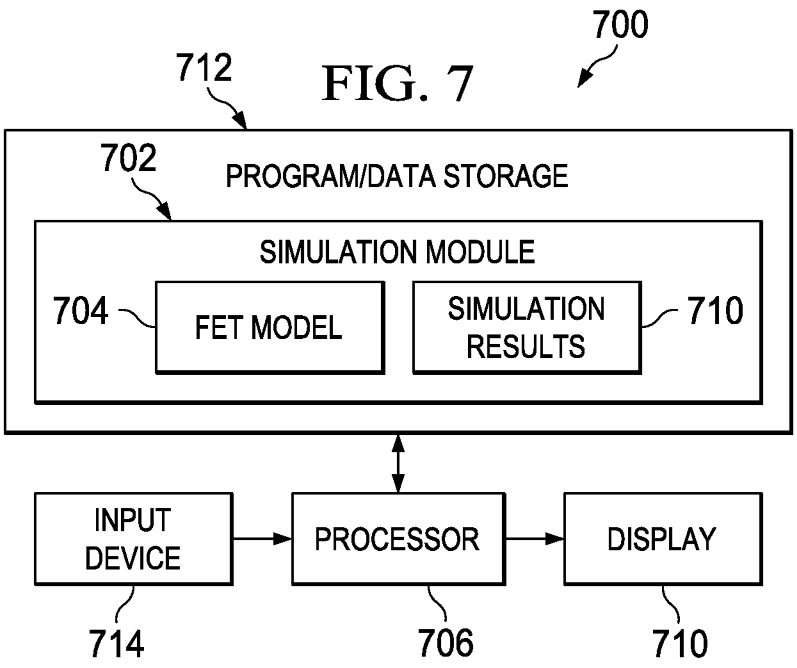
FIG. 7 shows a block diagram of a circuit simulation system for simulating a NFET with gate-drain SBD or HBD in accordance with various embodiments.

FIG. 7 shows a block diagram of a circuit simulation system 700 for simulating a NFET with gate-drain SBD or HBD in accordance with various embodiments. The system 700 includes a display 710, an input device 714, a processor 706, and data/program storage 712. The input device 714 may be, for example, a keyboard, a mouse, a trackball, a touchscreen, or any other device for providing data or control input to a computer. Embodiments of the system 700 can also include various input/output sub-systems to implement, for example, wired and/or wireless networking. The system 700 may be implemented using a computer, such as desktop computer, a workstation, a laptop computer, a blade computer, a server, etc. as known in the art.

The display device 710 provides information to a user of the system 700, and can be, for example, a liquid crystal display ("LCD"), organic light emitting diode ("OLED") display or any other display technology useable to display data.

The processor 706 of system 700 can be a general-purpose microprocessor, microcontroller, digital signal processor, etc. configured to execute software programs. The components of a processor are well known in that art and generally include execution units (e.g., integer, fixed point, floating point, etc.), instruction decoders, registers, memories, input/output ports, etc., interconnected by buses.

Data/program storage 712 is coupled to the processor 706. Data/program storage 712 is a computer-readable medium that can include various storage media and/or devices. For example, the storage 712 can include magnetic storage (e.g., hard disks, floppy disks, tape, etc.), optical storage (e.g., compact disk, digital video disk, etc.), semiconductor memory (e.g., static or dynamic random-access-memory ("SRAM" or "DRAM"), read-only-memory ("ROM"), FLASH memory, magnetic random access memory ("MRAM"), etc.), and the like.

The system 700 includes a simulation module 702 stored in storage 712 that when executed by the processor 706 provides simulation of electronic circuits. For example, the simulation module 702 may include SPICE executables. The simulation module 702 uses device models to perform the circuit simulations. The simulation system 702 includes a FET model 704 to simulate FET operations. The FET model 704 may include a NFET SBD and/or HBD equivalent circuit as disclosed herein. Using the FET model 704, embodiments of the simulation system 700 produces simulation results 708, e.g., simulated signals, that accurately represent operation of an NFET experiencing SBD or HBD. Simulation results may also be displayed on the display device 710.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A circuit simulation system, comprising:

a processor; and a circuit simulator module that when executed causes the processor to simulate operation of an electronic circuit; the circuit simulator module comprising:

a field effect transistor (FET) model, the FET model configured to emulate a FET in a condition of dielectric breakdown, the FET model comprising models of:

a primary FET;

a first depletion mode FET and a second depletion mode FET connected between a gate and a drain of the primary FET;

wherein a gate and a drain of the first depletion mode FET are connected to the gate of the primary FET, and a gate and a drain of the second depletion mode FET are connected to the drain of the primary FET.

2. The circuit simulation system of claim 1, wherein the FET model further comprises models of:

a first resistor through which the drain of the primary FET is connected to a source of the first depletion mode FET; and a second resistor through which the gate of the primary FET is connected to a source of the second depletion mode FET.

3. The circuit simulation system of claim 1, wherein the FET model further comprises a model of a drain-source FET; wherein a gate of the drain-source FET is connected to the drain of the primary FET, a drain of the drain-source FET is connected via a resistor to a source of the primary FET, and a source of the drain-source FET is the source terminal of the primary FET.

4. The circuit simulation system of claim 1, wherein the FET model further comprises a model of a controllable tunneling diode; wherein a cathode of the diode is connected via a series resistor to a source of the primary FET, an anode of the diode is connected to the gate of the primary FET, and a control terminal of the diode is connected to the drain of the primary FET.

5. The circuit simulation system of claim 1, wherein the FET model further comprises models of:

a diode, an anode of the diode connected to the drain of the primary FET and a cathode of the diode connected, via a series resistor, to a P-well bias voltage of the primary FET; and a resistor connected to the drain and P well bias voltage in parallel with the diode and series resistor.

6. The circuit simulation system of claim 1, wherein the FET model further comprises models of:

a first resistor connecting the gate and source of the primary FET;

a second resistor connecting the gate and drain of the primary FET; and a third resistor connecting the drain and source of the primary FET.

7. The circuit simulation system of claim 1, wherein the models of the first depletion mode FET and the second depletion mode FET are configured to simulate saturation mode operation.

8. A non-transitory computer-readable storage medium encoded with a field effect transistor (FET) model that causes a computer to simulate:

a primary FET; and two depletion mode FETs operating in saturation between a gate and a drain of the primary FET; wherein the depletion mode FETs provide a polarity symmetric gate current and emulate a power law exponent.

9. The computer-readable storage medium of claim 8, wherein the model causes the computer to simulate a voltage controller resistor interposed between a source and source terminal of the primary FET, the resistance of the voltage controlled resistor determined based on voltage at the drain of the primary FET.

10. The computer-readable storage medium of claim 8, wherein the model causes the computer to simulate a gate channel oxide tunneling diode connecting source and gate of the primary FET and controlled by the drain of the primary FET.

11. The computer-readable storage medium of claim 8, wherein the model causes the computer to simulate P-well bias current of the primary FET changing as an exponential function of gate voltage of the primary FET.

12. The computer-readable storage medium of claim 8, wherein the model causes the computer to simulate current flowing in gate and drain of the primary FET based on gate and drain of the primary FET being at equal voltage.

13. The computer-readable storage medium of claim 8, wherein the model causes the computer to simulate the power law exponent over a range of exponents from 1 to 2.

14. A method, comprising:

simulating, by a computer, operation of a field effect transistor (FET); the simulating comprising:

computing, by the computer, signal values based on a model of the FET, the model emulating:

a primary FET; and a first and a second depletion mode FET operating in saturation between a gate and a drain of the primary FET; a gate and a drain of the first depletion mode FET being connected to the gate of the primary FET, and a gate and a drain of the second depletion mode FET being connected to the drain of the primary FET.

15. The method of claim 14, wherein the model emulates a first resistor through which the drain of the primary FET is connected to a source of the first depletion mode FET; and a second resistor through which the gate of the primary FET is connected to a source of the second depletion mode FET.

16. The method of claim 14, wherein the model emulates a drain-source FET disposed as a source terminal of the primary FET; wherein a gate of the drain-source FET is connected to the drain of the primary FET, a drain of the drain-source FET is connected via a resistor to a source of the primary FET, and a source of the drain-source FET is the source terminal of the primary FET.

17. The method of claim 14, wherein the model emulates a controllable tunneling diode; wherein a cathode of the diode is connected via a series resistor to a source of the primary FET, an anode of the diode is connected to the gate of the primary FET, and a control terminal of the diode is connected to the drain of the primary FET.

18. The method of claim 14, wherein the model emulates:

a diode, an anode of the diode connected to the drain of the primary FET and a cathode of the diode connected, via a series resistor, to a P-well bias voltage of the primary FET; and a resistor connected to the drain and P well bias voltage in parallel with the diode and series resistor.

19. The method of claim 14, wherein the model emulates:

a first resistor connecting the gate and source of the primary FET;

a second resistor connecting the gate and drain of the primary FET; and a third resistor connecting the drain and source of the primary FET.

20. A circuit comprising:

a primary field effect transistor (FET); and a first depletion mode FET and a second depletion mode FET connected between a gate and a drain of the primary FET;

wherein a gate and a drain of the first depletion mode FET are connected to the gate of the primary FET, and a gate and a drain of the second depletion mode FET are connected to the drain of the primary FET;

wherein the first depletion mode FET and a second depletion mode FET operate in saturation.

21. The circuit of claim 20, further comprising:

a first resistor through which the drain of the primary FET is connected to a source of the first depletion mode FET; and a second resistor through which the gate of the primary FET is connected to a source of the second depletion mode FET.

22. The circuit of claim 20, further comprising at least one of:

a drain-source FET, wherein a gate of the drain-source FET is connected to the drain of the primary FET, a drain of the drain-source FET is connected via a resistor to a source of the primary FET, and a source of the drain-source FET is the source terminal of the primary FET;

a controllable tunneling diode, wherein a cathode of the diode is connected via a series resistor to a source of the primary FET, an anode of the diode is connected to the gate of the primary FET, and a control terminal of the diode is connected to the drain of the primary FET;

a P-well bias network comprising:

a diode, an anode of the diode connected to the drain of the primary FET and a cathode of the diode connected, via a series resistor, to a P-well bias voltage of the primary FET; and a resistor connected to the drain and P well bias voltage in parallel with the diode and series resistor; and a resistor network comprising:

a first resistor connecting the gate and source of the primary FET;

a second resistor connecting the gate and drain of the primary FET; and a third resistor connecting the drain and source of the primary FET.

* * * * *